(12) United States Patent
Aoki et al.

(10) Patent No.: US 7,223,802 B2
(45) Date of Patent: May 29, 2007

(54) HIGH ORDER SILANE COMPOSITION, AND METHOD OF FORMING SILICON FILM USING THE COMPOSITION

(75) Inventors: Takashi Aoki, Suwa (JP); Masahiro Furusawa, Chino (JP); Yasuo Matsuki, Tokyo (JP); Haruo Iwasawa, Tokyo (JP); Yasumasa Kateuchi, Tokyo (JP)

(73) Assignees: Seiko Epson Corporation (JP); JSR Corporation (JP)

( * ) Notice: Subject to any disclaimer, the term of this patent is extended or adjusted under 35 U.S.C. 154(b) by 22 days.

(21) Appl. No.: 10/420,521

(22) Filed: Apr. 22, 2003

(65) Prior Publication Data

US 2003/0229190 A1 Dec. 11, 2003

(30) Foreign Application Priority Data

Apr. 22, 2002 (JP) .............................. 2002-119961

(51) Int. Cl.
C08F 2/46 (2006.01)
H01L 21/20 (2006.01)

(52) U.S. Cl. ....................... 522/148; 522/172; 522/81; 438/478; 438/482; 438/488; 438/489; 524/861

(58) Field of Classification Search ................. 522/99, 522/148, 172; 438/478, 482, 486, 488, 497, 438/502; 524/861; 42/337
See application file for complete search history.

(56) References Cited

U.S. PATENT DOCUMENTS

| 6,514,801 | B1 | 2/2003 | Yudasaka et al. | |
| 6,518,087 | B1 * | 2/2003 | Furusawa et al. | 438/96 |
| 6,541,354 | B1 * | 4/2003 | Shimoda et al. | 438/478 |
| 6,864,133 | B2 * | 3/2005 | Aoki et al. | 438/197 |
| 6,884,700 | B2 * | 4/2005 | Aoki et al. | 438/502 |
| 2003/0045632 | A1 * | 3/2003 | Shiho et al. | 524/861 |
| 2003/0234398 | A1 * | 12/2003 | Aoki et al. | 257/72 |
| 2004/0029364 | A1 * | 2/2004 | Aoki et al. | 438/478 |

FOREIGN PATENT DOCUMENTS

| EP | 0 152 704 | 8/1985 |
| EP | 1 085 560 | 3/2001 |
| EP | 1 113 502 | 7/2001 |
| EP | 1 284 306 | 2/2003 |
| GB | 2077 710 | 12/1981 |
| JP | 57-27915 | 2/1982 |
| JP | 60-188429 | 9/1985 |
| JP | 64-029661 | 1/1989 |
| JP | 5-144741 | 6/1993 |
| JP | 06-191821 | 7/1994 |
| JP | 7-267621 | 10/1995 |
| JP | 10-321536 | 12/1998 |
| JP | 11-260729 | 9/1999 |
| JP | 2000-007317 | 1/2000 |
| JP | 2000-031066 | 1/2000 |
| JP | 2001-262058 | 9/2001 |
| JP | 2001-308020 | 11/2001 |
| JP | 2001-348219 | 12/2001 |
| JP | 2003-055556 | 2/2003 |
| JP | 2003-124486 | 4/2003 |
| JP | 2003-171556 | 6/2003 |
| JP | 2003-316279 | 11/2003 |
| JP | 2003-318119 | 11/2003 |
| JP | 2003-318120 | 11/2003 |
| JP | 2003-318191 | 11/2003 |
| JP | 2003-318193 | 11/2003 |
| WO | WO00/58409 | 10/2000 |
| WO | WO00/59040 | 10/2000 |
| WO | WO0059015 | * 10/2000 |
| WO | WO0059044 | * 10/2000 |

OTHER PUBLICATIONS

European Search Report, EP Application No. 03252524.8.
Communication from Korean Patent Office regarding related application.
Communication from Japanese Patent Office (with translation) regarding related application.

* cited by examiner

*Primary Examiner*—Sanza L. McClendon
(74) *Attorney, Agent, or Firm*—Harness, Dickey & Pierce, P.L.C.

(57) ABSTRACT

It is an object of the present invention to provide a high order silane composition that contains a polysilane having a higher molecular weight than conventionally, this being from the viewpoints of wettability when applying onto a substrate, boiling point and safety, and hence in particular enables a high-quality silicon film to be formed easily, and also a method of forming an excellent silicon film using the composition. The present invention attains this object by providing a high order silane composition containing a polysilane obtained through photopolymerization by irradiating a solution of a photopolymerizable silane or a photopolymerizable like-liquid silane with ultraviolet light. Moreover, the present invention provides a method of forming a silicon film comprising the step of applying such a high order silane composition onto a substrate.

8 Claims, 1 Drawing Sheet

HIGH ORDER SILANE COMPOSITION, AND METHOD OF FORMING SILICON FILM USING THE COMPOSITION

BACKGROUND OF THE INVENTION

1. Field of the Invention

The present invention relates to a high order silane composition and a method of forming a silicon film that can be used in particular with integrated circuits, thin film transistors, photoelectric converters, photoreceptors, and so on. Specifically, the present invention relates to a high order silane composition that in particular enables a high-quality silicon film to be formed easily, and a method of forming an excellent silicon film using the composition.

2. Description of the Related Art

Patterning of silicon thin films (amorphous silicon films, polysilicon films, etc.) used with integrated circuits, thin film transistors, and so on is generally carried out through a process in which a silicon film is formed over the whole surface by a vacuum process such as CVD (chemical vapor deposition), and then unwanted parts are removed by photolithography. However, with this method, there are problems such as a large apparatus being required, the efficiency of usage of the raw material being poor, the raw material being difficult to handle due to being a gas, and a large amount of waste being generated.

Japanese Patent Application Laid-open No. 1-29661 discloses a method in which a gaseous raw material is liquefied and attached on a cooled substrate, and is then reacted with chemically active atomic hydrogen, thus forming a silicon-based thin film. However, there is a problem in that the raw material silane is continuously vaporized and cooled, and hence a complicated apparatus is required, and moreover it is difficult to control the film thickness.

Moreover, Japanese Patent Application Laid-open No. 5-144741 and Japanese Patent Application Laid-open No. 7-267621 disclose methods in which a liquid silane is applied onto a substrate, and then a silicon film is produced through heating or UV irradiation. However, with these methods, a low-molecular-weight material is used, and hence the system is unstable and handling is problematic. Moreover, with these methods, the wettability to the substrate of the solutions used is poor, and hence the application onto the substrate is intrinsically difficult, and moreover the boiling point is low due to the molecular weight being low, and hence during the heating evaporation occurs more quickly than formation of the silicon film, and thus it is extremely difficult to obtain the desired film. That is, how high the molecular weight is (i.e. how good the wettability is, how high the boiling point is, and how good the safety is) of the polysilane (high order silane) used as a material is an important point with regard to film formation.

As a method of resolving the above problem, Japanese Patent Application Laid-open No. 10-321536 suggests a method in which the wettability of a solution of a polysilane is improved by subjecting a mixture of the solution and a catalyst to thermal decomposition or photodecomposition as treatment before the application. With this method, it is necessary to mix a catalyst such as nickel into the solution, and hence there is a drawback that the properties of the silicon film are markedly degraded.

Regarding methods of directly synthesizing silane having a high molecular weight, synthesis procedures and refinement methods are both extremely problematic in general; there have been attempts at a method of directly synthesizing polysilane through thermal polymerization as disclosed in Japanese Patent Application Laid-open No. 11-260729, but at best $Si_9H_{20}$ is obtained and at a low yield, and at such a molecular size, the above-mentioned properties such as wettability are still insufficient.

Moving on, as a method of forming a silicon film containing an n-type or p-type dopant, in general the silicon film is first produced, and then the dopant is introduced therein by ion implantation. In contrast to this, Japanese Patent Application Laid-open No. 2000-31066 discloses a method in which, during a process of forming a silicon film from a polysilane solution as described above, a dopant source is mixed into the material liquid, whereby a doped silicon film is formed. However, with this method as well, there is the fundamental problem for the case of using a low-molecular-weight material that the polysilane solution evaporates during the heating process and hence the amount thereof drops, and accompanying this the dopant source also evaporates, and hence it is difficult to add the dopant effectively.

SUMMARY OF THE INVENTION

In view of the above, it is an object of the present invention to provide a high order silane composition that contains a polysilane having a higher molecular weight than conventionally, this being from the viewpoints of wettability when applying onto a substrate, boiling point and safety, and hence in particular enables a high-quality silicon film to be formed easily, and also a method of forming an excellent silicon film using the composition.

The present inventors carried out assiduous research, and as a result discovered that the above object can be attained through a composition containing a polysilane formed through a specific polymerization process using a solution of a silane having a cyclic silicon chain such as cyclopentasilane ($Si_5H_{10}$) as a silane having specific properties.

The present invention was accomplished based on the above discovery, and attains the above object by providing a high order silane composition containing a polysilane obtained through photopolymerization by irradiating a solution of a photopolymerizable silane with ultraviolet light.

Moreover, the present invention also provides a high order silane composition containing a polysilane obtained through photopolymerization by irradiating a photopolymerizable like-liquid silane with ultraviolet light.

Preferably, the boiling point of the polysilane at normal pressure is higher than the decomposition point thereof.

Moreover, preferably, the high order silane composition contains a solvent, wherein the boiling point of the solvent is lower than the decomposition point of the polysilane.

Moreover, preferably, the ultraviolet light has a wavelength such as not to decompose the solvent used in the solution of the photopolymerizable silane.

Particularly preferably, the ultraviolet light has a wavelength of at least 250 nm.

Moreover, preferably, the irradiation time of the ultraviolet light is in a range of 0.1 seconds to 120 minutes.

Moreover, preferably, the photopolymerizable silane has at least one cyclic structure in the molecule thereof.

Particularly preferably, the photopolymerizable silane is one represented by the general formula $Si_nX_{2n}$, wherein each X independently represents a hydrogen atom or a halogen atom, and n is an integer greater than or equal to 3.

Moreover, preferably, the high order silane composition further has a substance containing a group 3B element of the periodic table or a substance containing a group 5B element of the periodic table added thereto after irradiating with the ultraviolet light.

Alternatively, a substance containing a group 3B element of the periodic table or a substance containing a group 5B element of the periodic table is added to the solution of the photopolymerizable silane before irradiating with the ultraviolet light.

Moreover, preferably, the high order silane composition is for forming a silicon film.

The present invention also provides a method of forming a silicon film comprising the step of applying a high order silane composition as described above onto a substrate.

Preferably, in the method, after applying the high order silane composition onto the substrate, heat treatment and/or light treatment is/are carried out.

Alternatively, in the method, a composition containing a solvent is used as the high order silane composition, and after applying the composition onto the substrate, the solvent only is selectively removed, and then heat treatment and/or light treatment is/are carried out.

Figure 1:
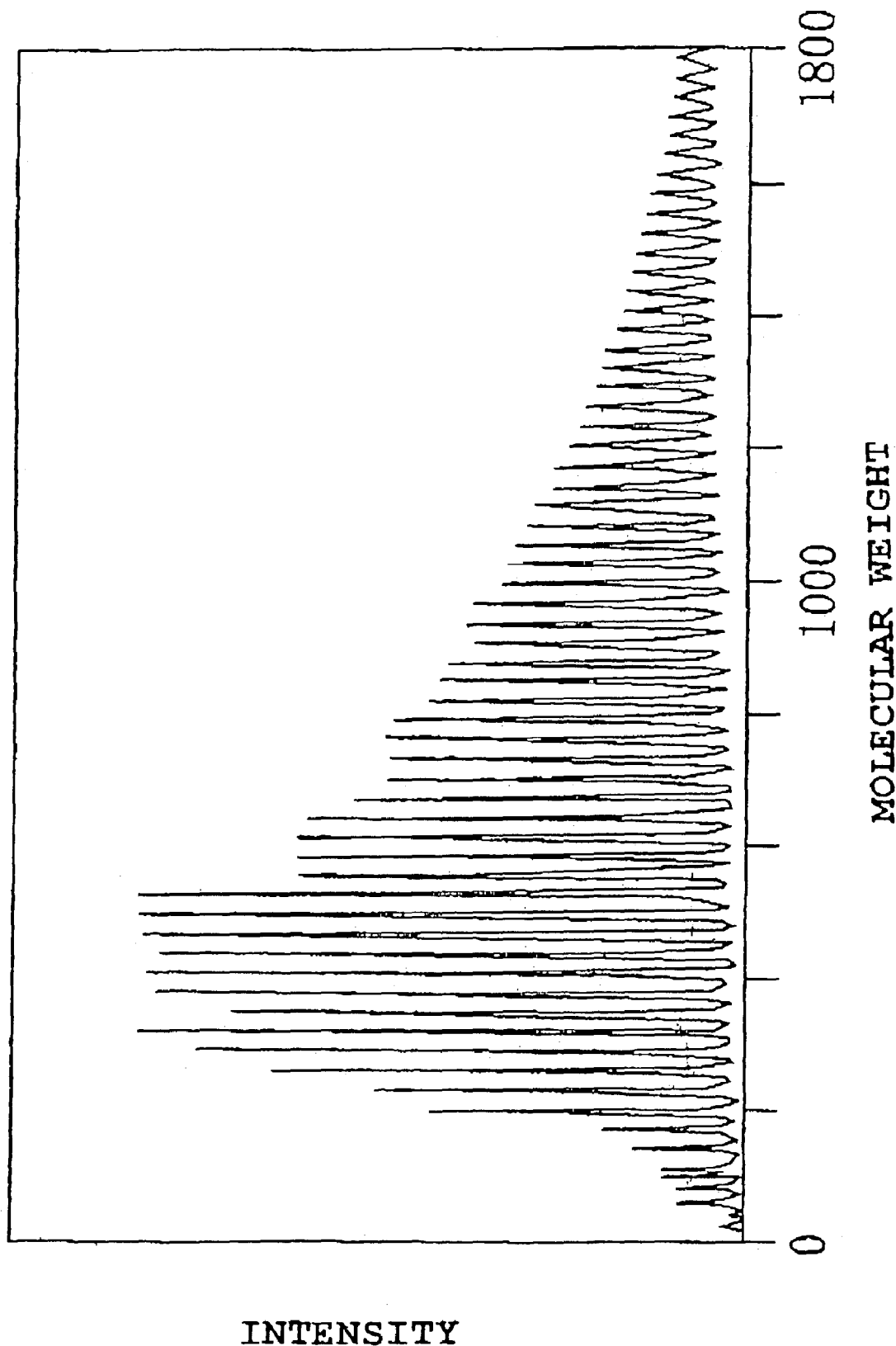
FIG. 1 is a MALDI-TOFMS spectrum of a polysilane obtained by irradiating a xylene solution of cyclopentasilane ($Si_5H_{10}$) with ultraviolet light to carry out photopolymerization.

DESCRIPTION OF THE PREFERRED EMBODIMENTS (High Order Silane Composition)

Following is a detailed description of the high order silane composition of the present invention through preferred embodiments thereof.

The high order silane composition of the present invention contains a polysilane as photopolymers obtained through photopolymerization by irradiating a solution of a photopolymerizable silane with ultraviolet (hereinafter referred to as 'UV') light. Because the polysilane in the present invention is formed by photopolymerizing a specific photopolymerizable silane by irradiating a solution of this silane with UV light in this way, the polysilane has a molecular weight incomparably larger than that of polysilane used in conventional silicon film formation methods (for example, in the case of $Si_6H_{14}$, the molecular weight is 182). Regarding the polysilane contained in the high order silane composition of the present invention, one having a molecular weight up to approximately 1800 have been identified (see the MALDI-TOFMS spectrum of FIG. 1).

Note that a photopolymerizable like-liquid silane may be used instead of the above-mentioned solution of a photopolymerizable silane, i.e. the high order silane composition of the present invention may also be a composition containing a polysilane obtained through photopolymerization by irradiating a photopolymerizable like-liquid silane with ultraviolet light.

Because the high order silane composition of the present invention comprises a solution of a polysilane having a high molecular weight in this way, when forming a silicon film in particular, extremely good wettability to the substrate is exhibited, and hence application onto the substrate can be carried out much more nicely than with a conventional method. Moreover, the polysilane contained in the high order silane composition of the present invention have an extremely high molecular weight. The higher the molecular weight of a polysilane, the lower the reactivity, and hence handling is safer than with a conventional polysilane.

Moreover, due to the very high molecular weight of the polysilane contained in the high order silane composition of the present invention, the boiling point of the polysilane at normal pressure is higher than the decomposition point thereof, and hence during heating and baking when forming a silicon film, there is no problem of the polysilane evaporating before the silicon film is formed.

Note that in actual practice if such a polysilane is heated, then decomposition occurs before the boiling point is reached, and hence the boiling point, which is higher than the decomposition point, cannot be determined experimentally. However, here the boiling point at normal pressure means the theoretical value thereof as determined from the temperature dependence of the vapor pressure or a theoretical calculation.

Moreover, if the high order silane composition of the present invention is used, then due to this property of the boiling point of the polysilane being higher than the decomposition point thereof, it is not necessary to heat rapidly so that a high temperature is reached before evaporation occurs as conventionally. It is thus possible to use a process in which the temperature is raised only gradually, or heating is carried out to a relatively low temperature while reducing the pressure. This means that the speed of bonding between silicons when forming the silicon film can be controlled, and moreover by using a method in which the temperature is maintained at a temperature that is not so high that the silicon film is formed but is higher than the boiling point of the solvent, it becomes possible to reduce the amount in the silicon film of the solvent, which may cause degradation of the properties of the silicon, more efficiently than with a conventional method.

For reasons such as the above, it is preferable for the boiling point of the polysilane contained in the high order silane composition of the present invention to be higher than the decomposition point thereof. Such a polysilane for which the boiling point thereof is higher than the decomposition point thereof can easily be obtained by selecting a preferable silane as described later as the raw material silane, selecting a preferable UV wavelength, irradiation time, irradiation method, and irradiation energy as described later for the irradiated UV light, and selecting a preferable solvent as the solvent used and a preferable method of refinement after the UV irradiation.

According to the high order silane composition of the present invention, due to the effects described above, a silicon film can be formed more easily and to a higher quality than with a conventional method. The amorphous silicon film formed in this way can of course subsequently be crystallized using a method such as heat treatment or excimer laser annealing, thus further improving the properties.

In the present invention, the molecular weight distribution of the polysilane can be controlled through the UV irradiation time, irradiation dose, and irradiation method. Moreover, the polysilane can be subjected to separation refinement using GPC, which is a common polymer refinement method, or the like after the silane has been irradiated with the UV light, whereby a polysilane of a desired molecular weight can be extracted. Moreover, refinement can also be carried out by utilizing the difference in solubility between polysilane having different molecular weights. Moreover, refinement can also be carried out through fractional distillation, utilizing the difference in boiling point at either normal pressure or under reduced pressure between polysilane having different molecular weights. By controlling the molecular weight of the polysilane in the high order silane composition in this way, it becomes possible to obtain high-quality silicon films with fluctuations in properties suppressed yet further.

The higher the molecular weight of the polysilane, the higher the boiling point, and the lower the solubility in the solvent. Consequently, depending on the UV irradiation conditions, after the photopolymerization there may be a polysilane that will not completely dissolve in the solvent but rather precipitate out; in this case, the high order silane composition can be refined by using a method of filtering with a microfilter or the like to remove insoluble components.

The ultraviolet (UV) light irradiated onto the silane solution preferably has a wavelength such as not to decompose the solvent used in the solution; specifically, this wavelength is preferably at least 250 nm, particularly preferably at least 300 nm. In the present invention, 'a wavelength such as not to decompose the solvent' means a wavelength such that chemical bonds in the solvent molecules are not broken by the irradiation with the ultraviolet light. By using UV light having a wavelength as described above, it is possible to prevent impurity atoms such as carbon atoms originating from the solvent being present in the silicon film after heat treatment and/or light treatment, and hence it becomes possible to obtain a silicon film having yet better properties.

From the standpoint of being able to obtain a polysilane having a desired molecular weight distribution, the UV irradiation time is preferably in a range of 0.1 seconds to 120 minutes, particularly preferably 1 to 30 minutes. Moreover, from the standpoint of being able to obtain a polysilane having a desired molecular weight distribution, as the UV irradiation method, it is preferable to carry out the irradiation after diluting the silane with a solvent, or carry out the UV irradiation uniformly over the whole of the solution of the silane while stirring the solution.

Moreover, the viscosity and surface tension of the high order silane composition of the present invention can easily be controlled through the adjustment methods described above with regard to the molecular weight distribution of the polysilane, and by adjusting the solvent. This is extremely advantageous in the process of carrying out patterning using droplet discharging, which is a great merit when forming a silicon film from a liquid.

There are no particular limitations on the silane for preparing the high order silane composition of the present invention, provided this silane is photopolymerizable, i.e. can be polymerized through irradiation with UV light; examples include a silane represented by the general formula $Si_nX_m$ (wherein n represents an integer greater than or equal to 3, m represents an integer greater than or equal to 4, with n and m being independent of one another, and each X independently represents a substituent such as a hydrogen atom or a halogen atom).

Examples of such silanes are all photopolymerizable silane that can be used in the process of photopolymerization through irradiation with ultraviolet light in the present invention, for example a cyclic silane represented by the general formula $Si_nX_{2n}$ (wherein n represents an integer greater than or equal to 3, and each X independently represents a hydrogen atom or a halogen atom), a silane having two or more cyclic structures represented by the general formula $Si_nX_{2n-2}$ (wherein n represents an integer greater than or equal to 4, and each X independently represents a hydrogen atom or a halogen atom), and other silanes having at least one cyclic structure in the molecule thereof and halogen-substituted derivatives thereof.

Specific examples of such silanes include cyclotrisilane, cyclobutasilane, cyclopentasilane, cyclohexasilane, cycloheptasilane and so on as ones having one cyclic structure, 1,1'-bicyclobutasilane, 1,1'-bicyclopentasilane, 1,1'-bicyclohexasilane, 1,1'-bicycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2,2]pentasilane, spiro[3,3]heptasilane, spiro[4,4]nonasilane, spiro[4,5]decasilane, spiro[4,6]undecasilane, spiro[5,5]undecasilane, spiro[5,6]undecasilane, spiro[6,6]tridecasilane and so on as ones having two cyclic structures, and also silanes in which some of the hydrogen atoms in the above compounds are substituted with $SiH_3$ groups or halogen atoms. Two or more of these silanes can be used mixed together.

Of these silanes, ones having a cyclic structure in at least one place in the molecule thereof have an extremely high reactivity to light, and can thus be photopolymerized efficiently, and hence it is preferable to use such a silane having a cyclic structure in at least one place in the molecule thereof as a raw material. Of such a silane having a cyclic structure in at least one place in the molecule thereof, a silane represented by the general formula $Si_nX_{2n}$ (wherein n represents an integer greater than or equal to 3, and each X independently represents a hydrogen atom or a halogen atom such as a fluorine atom, a chlorine atom, a bromine atom or an iodine atom) such as cyclotetrasilane, cyclopentasilane, cyclohexasilane and cycloheptasilane are particularly preferable from the viewpoint of synthesis and refinement being easy, as well as for the reasons described above.

Note that although a silane having at least one cyclic structure as described above is preferable as the silane, if necessary a silane such as n-pentasilane, n-hexasilane or n-heptasilane, a modified silane that has been modified with boron atoms(s) and/or phosphorus atom(s), or the like may be used together with the silane having at least one cyclic structure, so long as the process of photopolymerization through irradiation with ultraviolet light in the present invention is not inhibited.

Moreover, there are no particular limitations on the solvent for forming the silane solution, so long as this solvent is one that dissolves the silane but does not react with the silane; in general a solvent having a vapor pressure in a range of 0.001 to 200 mmHg at room temperature is used. If the vapor pressure is higher than 200 mmHg, then when forming the coating film the solvent will evaporate before the coating film is formed, and hence it will be difficult to form a good coating film. On the other hand, if the vapor pressure is lower than 0.001 mmHg, then when forming the coating film drying will be slow, and hence solvent will become prone to remaining behind in the coating film of the silicon compounds, and hence it will be difficult to obtain a high-quality silicon film even after the subsequent heat treatment and/or light treatment.

Moreover, as the solvent, it is preferable to use one having a boiling point at normal pressure that is higher than room temperature, but lower than the decomposition point of the polysilane, i.e. 250° C. to 300° C. By using a solvent having a boiling point lower than the decomposition point of the polysilane, it is possible to selectively remove the solvent only by heating after the application without decomposing the polysilane, and hence it is possible to prevent solvent from remaining behind in the silicon film, and thus a higher quality silicon film can be obtained.

Specific examples of the solvent used in the silane solution include hydrocarbon solvents such as n-hexane, n-heptane, n-octane, n-decane, dicyclopentane, benzene, toluene, xylene, durene, indene, tetrahydronaphtahalene, decahydronaphtahalene and squalane, and also ether solvents such as dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1,2-dimethoxyethane, bis(2-methoxyethyl) ether and p-dioxane, and moreover polar solvents such as propylene carbonate, γ-butyrolactone, N-methyl-2-pyrrolidone, dimethylformamide, acetonitrile and dimethylsulfoxide. Of these solvents, from the standpoint of the solubility of the silane and the stability of the solution, hydrocarbon solvents and ether solvents are preferable, with hydrocarbon solvents being particularly preferable. These solvents can be used alone, or two or more many be used mixed together.

Moreover, before the irradiation with the ultraviolet light, a substance containing a group 3B element of the periodic table or a substance containing a group 5B element of the periodic table (a dopant source) can be added to the silane solution. When forming a silicon film, the process of irradiating with UV light after putting such a dopant source into the silane solution is a novel process not seen with conventional methods. According to this process, bonding between the dopant and the polysilane at a molecular level can be brought about through the irradiation with the UV light, and hence by applying the solution onto a substrate and carrying out heat treatment and/or light treatment, an n-type or p-type doped silicon film having good properties can be formed. The doped silicon film formed through this process can of course then be subjected to a step such as heating, thus further improving the properties. In particular, it is possible to apply onto a substrate the high order silane composition formed from the silane solution containing the substance (dopant source), and then carry out heat treatment and/or light treatment as described later, thus activating the substance (dopant).

Moreover, the concentration of the dopant source added should be determined in accordance with the dopant concentration ultimately required in the silicon film; the concentration may be adjusted by diluting with a solvent after the UV irradiation, or the dopant source may be mixed into a high order silane composition that has been subjected to UV irradiation without adding the dopant source.

Examples of such substances containing a group 3B element of the periodic table and substances containing a group 5B element of the periodic table (dopant sources) are substances containing an element such as phosphorus, boron or arsenic, specifically substances such as those cited in Japanese Patent Application Laid-open No. 2000-31066.

The concentration of the polysilane in the high order silane composition formed through photopolymerization by irradiating the silane solution with UV light is preferably approximately 1 to 80 wt % from the standpoint of preventing uneven precipitation of the polysilane after application onto a substrate when forming a silicon film, and thus being able to obtain a uniform coating film; this concentration can be adjusted as appropriate in accordance with the desired silicon film thickness.

The high order silane composition of the present invention comprises a solution containing the polysilane and the solvent, and moreover other additives can be added as required.

A substance containing a group 3B element of the periodic table or a substance containing a group 5B element of the periodic table can be added as a dopant source to the high order silane composition of the present invention. By appropriately selecting and adding such a substance, a desired n-type or p-type silicon film having a dopant introduced therein can be formed. In the process of forming a silicon film using a high order silane composition to which such a substance has been added, because the polysilane has a high boiling point and hence is not prone to evaporating, evaporation of the dopant source can also be suppressed, and hence the introduction of the dopant into the film can be carried out more efficiently than with a conventional method. Note that in the case that the substance is added to the silane solution before irradiating with UV light to form the polysilane as described earlier, there is no need to add the substance at the present stage (after the UV irradiation). Examples of substances containing a group 3B element of the periodic table and substances containing a group 5B element of the periodic table are the same as those given for the case of adding such a substance to the silane before the UV irradiation as described earlier. Moreover, after the high order silane composition has been applied onto a substrate, the substance (dopant) can be activated through heat treatment and/or light treatment as described later.

Moreover, a small amount of a surface tension regulating agent of a fluorinated type, a silicone type, a nonionic type or the like can be added to the high order silane composition of the present invention as required, so long as this is within a range such that the desired functions of the high order silane composition are not damaged. Such surface tension regulating agents are useful in improving the wettability of the solution to the article onto which the solution is applied, and thus improving the leveling ability of the applied film, and preventing the occurrence of lumps in the coating film, the occurrence of orange peel, and so on.

The viscosity of the high order silane composition of the present invention is generally in a range of 1 to 100 mPa·s, and can be selected as appropriate in accordance with the coating apparatus and the desired coating film thickness. If the viscosity is greater than 100 mPa·s, then it becomes difficult to obtain a uniform coating film.

The high order silane composition of the present invention is useful for forming silicon films used in particular with integrated circuits, thin film transistors, photoelectric converters, photoreceptors, and so on.

(Method of Forming Silicon Film)

Next, a detailed description will be given of a method of forming a silicon film of the present invention.

The method of forming a silicon film of the present invention is characterized by applying a high order silane composition as described above onto a substrate; with regard to other points, the same procedure can be used as with a method of forming a silicon film using an ordinary solution. The method of forming a silicon film of the present invention preferably includes a step of carrying out heat treatment and/or light treatment after applying the high order silane composition onto the substrate. Moreover, in the case of using a composition containing a solvent as the high order silane composition, after applying the composition onto the substrate, a step of selectively removing the solvent only may be included before the step of carrying out heat treatment and/or light treatment.

The method of forming a silicon film of the present invention is not a method in which a gas is fed in as in the commonly used CVD method, but rather is a method in which a high order silane composition as described above is applied onto a substrate, then the solvent is dried off to form a film of a polysilane, and then the film is converted into a silicon film by carrying out thermal decomposition and/or photodecomposition, or is converted into a polycrystalline silicon film by carrying out thermal decomposition and/or photodecomposition and then further carrying out laser treatment. Furthermore, according to the method of forming a silicon film of the present invention, a p-type or n-type silicon film modified with boron atoms or phosphorus atoms can be formed without carrying out ion implantation in a vacuum system.

As the method of applying the high order silane composition, a method such as spin coating, roll coating, curtain coating, dip coating, spraying, or droplet discharging can be used. The application is generally carried out at a temperature above room temperature. At a temperature below room temperature, the solubility of the polysilane will drop, and hence partial precipitation may occur. The silane, polysilane, and high order silane composition in the present invention degenerate through reaction with water and oxygen, and hence it is preferable to carry out the series of steps in a state in which water and oxygen are not present. The series of steps is thus preferably carried out in an atmosphere of an inert gas such as nitrogen, helium or argon. Furthermore, it is preferable for a reducing gas such as hydrogen to be mixed into the atmosphere as required. Moreover, it is preferable for the solvent and additives used to be ones from which water and oxygen have been removed.

Note that in the present invention a 'droplet discharging method' is a method in which droplets are discharged in desired regions, thus forcing a desired pattern containing the discharged material, and is also known as an ink jet method. Note, however, that in the present case, the discharged droplets are not of an ink used on a printed article, but rather of a liquid containing a material that constitutes a device; such materials include, for example, materials that can function as a semiconducting material or an insulating material constituting a device. Furthermore, 'droplet discharging' is not limited to the case of discharging as a spray, but also includes the case that the liquid is discharged so that the droplets of the liquid are continuous.

Moreover, in the case of using spin coating, the rotational speed of the spinner is determined in accordance with the thickness of the thin film to be formed and the composition of the coating solution, but is generally in a range of 100 to 5000 rpm, preferably 300 to 3000 rpm.

In the method of forming a silicon film of the present invention, after the high order silane composition has been applied, heating is carried out to remove the solvent. The heating temperature varies according to the type and boiling point (vapor pressure) of the solvent used, but is generally in a range of 100 to 200° C. As with the application step described above, the heating is preferably carried out in an atmosphere of an inert gas such as nitrogen, helium or argon. At this time, by reducing the pressure of the system as a whole, the removal of the solvent can be carried out at a lower temperature. As a result, thermal degradation of the substrate can be reduced.

Moreover, in the method of forming a silicon film of the present invention, the polysilane on the substrate from which the solvent has been removed is converted into a silicon film through heat treatment and/or light treatment. The silicon film obtained through the method of the present invention is amorphous or polycrystalline; in the case of heat treatment, in general an amorphous silicon film is obtained if the temperature reached is less than approximately 550° C., whereas a polycrystalline silicon film is obtained if the temperature reached is higher than this. In the case that one wishes to obtain an amorphous silicon film, a temperature in a range of 300° C. to 550° C. is preferably used, more preferably 350° C. to 500° C. If the temperature reached is less than 300° C., then the thermal decomposition of the polysilane may not proceed sufficiently, and hence it may not be possible to form a silicon film of sufficient thickness.

In the present invention, the atmosphere when carrying out the heat treatment is preferably an inert gas such as nitrogen, helium or argon, or such an inert gas with a reducing gas such as hydrogen mixed therein. In the case that one wishes to obtain a polycrystalline silicon film, an amorphous silicon film obtained as described above can be converted into a polycrystalline silicon film by irradiating with a laser.

On the other hand, in the case of carrying out light treatment, examples of light sources that can be used include a low-pressure or high-pressure mercury lamp, a deuterium lamp, a discharge lamp of a noble gas such as argon, krypton or xenon, a YAG laser, an argon laser, a carbon dioxide laser, an excimer laser of XeF, XeCl, XeBr, KrF, KrCl, ArF, ArCl or the like, and so on. In general a light source with a power output in a range of 10 to 5000W is used, with 100 to 1000W usually being sufficient. There are no particular limitations on the wavelength of the light source, provided this wavelength is a wavelength at which the polysilane absorbs to some extent, but this wavelength is generally in a range of 170 nm to 600 nm. Moreover, from the standpoint of the efficiency of conversion into a polycrystalline silicon film, it is particularly preferable to use laser light. The temperature during the light treatment is generally between room temperature and 150° C., and can be selected as appropriate in accordance with the semiconductor properties of the silicon film to be obtained.

There are no particular limitations on the substrate used in the method of forming a silicon film of the present invention, but ordinary quartz, borosilicate glass, soda glass, a transparent electrode of ITO or the like, a substrate made of a metal such as gold, silver, copper, nickel, titanium, aluminum or tungsten, a glass or plastic substrate having such a metal on a surface thereof, and so on can be used.

Silicon films obtained using the method of forming a silicon film of the present invention can be used with integrated circuits, thin film transistors, photoelectric converters, photoreceptors, and so on.

EXAMPLES

Following is a more detailed description of the present invention through examples; however, the present invention is not limited to these examples.

All of the following examples were carried out under a nitrogen atmosphere with an oxygen concentration of not more than 1 ppm.

Examples 1 to 5

3 g of cyclohexasilane was dissolved in 10 ml of benzene, thus preparing a solution. The solution was put into a 20 ml glass beaker, was irradiated for 5 minutes with UV light of wavelength 308 nm at 20 mW/cm$^2$ while being stirred, and was then filtered using a 0.5 µm filter, thus obtaining a high order silane composition. The high order silane composition was taken as a coating solution and was applied onto quartz substrates using a spin coating method at 1000 rpm. The substrates onto which the high order silane composition had been applied were then baked under various conditions as shown in Table 1, thus forming a brown amorphous silicon film on the quartz substrates. The results of ESCA measurements (surface composition) and the results of Raman spectroscopy measurements (crystallization rate) on the amorphous silicon films obtained are also shown in Table 1.

TABLE 1

|  | Baking conditions | Silicon (%) | Oxygen (%) | Carbon (%) | Crystallization rate (%) |
|---|---|---|---|---|---|
| Example 1 | 30 min at 100° C., then 10 min at 350° C. | 87 | 12 | 0 | 5 |
| Example 2 | 30 min at 100° C., then 10 min at 500° C. | 98 | 2 | 0 | 20 |
| Example 3 | 10 min at 350° C. | 83 | 12 | 5 | 4 |
| Example 4 | 10 min at 500° C. | 93 | 2 | 5 | 15 |
| Example 5 | Temperature increased at 50° C./min up to 500° C. | 96 | 2 | 2 | 10 |

In Examples 1 and 2, heating was first carried out at 100° C. to remove the benzene solvent, and then baking was carried out at 350° C. or 500° C. to convert the polysilane into an amorphous silicon film. At 350° C., the baking was insufficient, and hence the film partially oxidized after the baking, but with Example 2 in which the baking was carried out at 500° C., a high-quality silicon film containing hardly any oxygen could be formed.

Moreover, in Examples 3 and 4, a solvent removal step like that used in Examples 1 and 2 was not carried out, and hence there was a problem that carbon atoms from the benzene solvent remained in the silicon film.

Moreover, in Example 5, the silicon film was formed by raising the temperature from room temperature at a rate of 50° C. per minute, and then stopping the heating after approximately 10 minutes once the temperature had reached 500° C. Because the rate of increasing the temperature was high, the solvent could not be eliminated completely, and hence there was residual carbon in the silicon film; nevertheless, it was possible to carry out the removal of the solvent and the baking of the polysilane in a short time of only 10 minutes, and a high-quality silicon film containing at least 96% silicon could be obtained.

A 308 nm exciter laser was irradiated at an energy density of 300 mJ/cm$^2$ onto an amorphous silicon film obtained as in Example 2 in an argon atmosphere. As a result of Raman spectroscopy measurements, it was found that a polycrystalline silicon film having a crystallization rate of 90% was obtained.

An amorphous silicon film obtained as in Example 2 was subjected to heat treatment for 10 hours at 800° C. in an argon atmosphere containing 3% of hydrogen, and then Raman spectroscopy measurements were carried out, whereupon it was found that the amorphous silicon film had been converted into a polycrystalline silicon film having a crystallization rate of 95%.

Examples 6 to 11

5 g of cyclopentasilane was dissolved in 20 ml of xylene, thus preparing a solution. The solution was put into a 50 ml glass beaker, and was irradiated with UV light under any of various irradiation conditions as shown in Table 2 while being stirred. Each of the solutions was then filtered using a 0.5 µm filter to remove insoluble components, whereby high order silane compositions were obtained. Each of the high order silane compositions was taken as a coating solution and was applied onto a quartz substrate using a spin coating method at 1500 rpm. Each of the substrates onto which a high order silane composition had been applied was then heated for 30 minutes at 120° C. while reducing the pressure to 5 Torr to remove the xylene solvent, and was then baked for 10 minutes at 500° C., thus forming a brown amorphous silicon film on the quartz substrate.

The UV wavelength used, the irradiation time, the irradiation dose, the results of ESCA measurements (surface composition), and the results of film thickness measurements by ellipsometry are shown in Table 2 for each case.

TABLE 2

|  | UV irradiation conditions | Silicon (%) | Oxygen (%) | Carbon (%) | Film thickness (nm) |
|---|---|---|---|---|---|
| Example 6 | 436 nm, 10 min: 20 mW/cm$^2$ | 98 | 2 | 0 | 180 |
| Example 7 | 436 nm, 20 min: 20 mW/cm$^2$ | 98 | 2 | 0 | 240 |
| Example 8 | 254 nm, 10 min: 15 mW/cm$^2$ | 98 | 2 | 0 | 260 |
| Example 9 | 254 nm, 20 min: 15 mW/cm$^2$ | 98 | 2 | 0 | 310 |
| Example 10 | 172 nm, 10 min: 10 mW/cm$^2$ | 87 | 1 | 12 | 360 |
| Example 11 | 172 nm, 20 min: 10 mW/cm$^2$ | 84 | 1 | 15 | 540 |

From the results of Examples 6 to 11, it was found that the film thickness varies according to the UV irradiation energy and irradiation time, and hence that an amorphous silicon film of a desired thickness can be obtained by suitably controlling the UV irradiation energy and irradiation time. Moreover, it can be seen that, with Examples 10 and 11, the methyl groups of the xylene solvent were detached by the UV light of wavelength 172 nm, and were taken into the amorphous silicon film.

Example 12

The viscosity of a high order silane composition prepared using the same method as in Example 9 described above was measured, and was found to be 70 mPa·s. Application using a droplet discharging method would be difficult in this state, and hence 10 ml of the solution was diluted with 100 ml of hexane, and long-chain polysilane that would not completely dissolve were filtered off using a 0.2 µm filter, thus preparing a new high order silane composition. The viscosity of this solution was 3 mPa·s. The solution was applied using a droplet discharging method over the whole of an upper surface of a quartz substrate that had been made lyophilic in advance by irradiating for 20 minutes with 10 mW of 254 nm UV light. Baking was subsequently carried out as in Example 9, whereby a uniform amorphous silicon film of thickness 120 nm could be obtained.

Example 13

10 ml of a high order silane composition prepared using the same method as in Example 9 described above was heated at 80° C. under a reduced pressure of 10 Torr, thus concentrating the high order silane composition down to 5 ml. Long-chain polysilane that would not completely dissolve were filtered off using a 0.2 μm filter, and then spin coating and baking were carried out as in Example 9, whereupon a silicon film having a thickness of 500 nm was obtained.

Examples 14 to 17

5 g of spiro[4,4]nonasilane was dissolved in 20 ml of cyclohexane, thus preparing a solution. 20 ml of the solution was put into a quartz beaker, and was irradiated for 10 minutes with UV light of wavelength 254 nm at 20 mW/cm² while being stirred. 50 g of one of the additives shown in Table 3 was added as a dopant source to the solution and was dissolved, and then filtration was carried out using a 0.5 μm filter to remove insoluble components, thus obtaining a high order silane composition. Each of the high order silane compositions was taken as a coating solution and was applied using a spin coating method at 1000 rpm onto a glass substrate on which electrodes had been formed in advance by photolithography. Each of the substrates onto which a high order silane composition had been applied was then heated for 30 minutes at 150° C. to remove the solvent, and then baking was carried out for 10 minutes at 400° C. while irradiating with UV light of wavelength 172 nm at 50 mW/cm², whereby a doped silicon film was obtained. The results of conductivity measurements on the doped silicon films are as shown in Table 3; it was found that high-quality doped silicon films doped to a high concentration could be obtained easily without using a vacuum process.

TABLE 3

|  | Additive | Conductivity (S/cm) |
| --- | --- | --- |
| Example 14 | $B_5H_9$ | $6.8 * 10^{-3}$ |
| Example 15 | $B_{10}H_{14}$ | $3.0 * 10^{-4}$ |
| Example 16 | P (yellow phosphorus) | $8.7 * 10^{-4}$ |
| Example 17 | $PH_3$ | $4.3 * 10^{-3}$ |

Examples 18 to 21

10 g of silylcyclohexasilane was dissolved in 30 ml of benzene, thus preparing a solution. 500 mg of one of the additives shown in Table 4 was added to the solution and dissolved in the benzene. Each of the mixtures was put into a 100 ml beaker, and was irradiated for 30 minutes with UV light of wavelength 254 nm at 20 mW/cm² while being stirred, thus carrying out photopolymerization of the silane and at the same time bonding the polysilane and the additive together. Next, each of the solutions was filtered using a 0.5 μm filter to remove insoluble components, whereby high order silane compositions each containing an additive were obtained. Each of the high order silane compositions was taken as a coating solution and was applied using a spin coating method at 2000 rpm onto a glass substrate on which electrodes had been formed in advance. Each of the substrates onto which a high order silane composition had been applied was then heated for 20 minutes at 110° C. to remove the solvent, and then baking was carried out for 10 minutes at 400° C., whereby a doped silicon film was obtained. The results of conductivity measurements on the doped silicon films are as shown in Table 4; it was found that, as with Examples 14 to 17, high-quality doped silicon films doped to a high concentration could be obtained easily without using a vacuum process.

TABLE 4

|  | Additive | Conductivity (S/cm) |
| --- | --- | --- |
| Example 18 | $B_5H_9$ | $2.6 * 10^{-4}$ |
| Example 19 | $B_{10}H_{14}$ | $7.8 * 10^{-4}$ |
| Example 20 | P(yellow phosphorus) | $1.5 * 10^{-3}$ |
| Example 21 | $PH_3$ | $7.2 * 10^{-3}$ |

Example 22

A 308 nm excimer laser was irradiated at an energy density of 360 mJ/cm² onto a doped silicon film produced as in Example 20 described above, thus converting the film into a polycrystalline silicon film. As a result of Raman spectroscopy measurements, it was found that the polycrystalline silicon film had a crystallization rate of 100%, and moreover the conductivity had increased to $2.6 \times 10^{-2}$ S/cm.

According to the high order silane composition of the present invention, from the viewpoints of wettability when applying onto a substrate, boiling point and safety, the high order silane composition contains a polysilane having a higher molecular weight than conventionally; as a result, in particular a high-quality silicon film can be formed easily. Moreover, according to the method of forming a silicon film of the present invention, an excellent silicon film can be obtained.

The entire disclosure of Japanese Patent Application No. 2002-119961 filed Apr. 22, 2002 is incorporated by reference.

What is claimed is:

1. A method of forming a silicon film over a substrate comprising:
    forming a first liquid material by adding a silane compound to a solvent, the silane compound being represented by the general formula $Si_nX_2$, each X independently representing a hydrogen atom or a halogen atom, and n being an integer greater than or equal to 3;
    irradiating the first liquid material with a light to form a second liquid material including a first polysilane component and a second polysilane component, a molecular weight of the first polysilane component being larger than a molecular weight of the second polysilane component such that the first polysilane component is a precipitate in the second liquid material;
    removing the precipitate from the second liquid material by filtering to form a third liquid material, a viscosity of the third liquid material being within the range of 1 to 100 m Pa·s; and
    applying the third liquid material to the substrate.

2. The method of forming a silicon film over a substrate film according to claim 1, further comprising:
    adding a substance to the first liquid material before irradiating the first liquid material with the light, wherein the substrate includes at least one of the group 3B elements of the periodic table and the group 5B elements of the periodic table.

3. The method of forming a silicon film over a substrate according to claim 1, wherein the silane compound is photopolymerized by irradiating the first liquid material with the light.

4. The method of forming a silicon film over a substrate according to claim 1, wherein the boiling point of the third liquid material at normal pressure is higher than the decomposition point of the third liquid material.

5. The method of forming a silicon film over a substrate according to claim 1, wherein the boiling point of the solvent is lower than the decomposition point of the third liquid material.

6. The method of forming a silicon film over a substrate according to claim 1, wherein the solvent is not decomposable by the light.

7. The method of forming a silicon film over a substrate according to claim 1, wherein the light has a wavelength of at least 250 nm.

8. The method of forming a silicon film over a substrate according to claim 1, third liquid material being applied to the substrate by a droplet discharging method.

\* \* \* \* \*